United States Patent [19]
Tani et al.

[11] Patent Number: 5,840,218
[45] Date of Patent: Nov. 24, 1998

[54] RESISTANCE MATERIAL COMPOSITION

[75] Inventors: Hiroji Tani, Nagaokakyo; Keisuke Nagata, Oumihachiman, both of Japan

[73] Assignee: Murata Manufacturing Co., Ltd., Kyoto, Japan

[21] Appl. No.: 738,320

[22] Filed: Oct. 25, 1996

[30] Foreign Application Priority Data

Oct. 25, 1995 [JP] Japan .................................. 7-302053

[51] Int. Cl.$^6$ .............................. H01B 1/06; B32B 9/00; A01C 7/00
[52] U.S. Cl. ...................... 252/521.5; 428/698; 428/704; 428/212; 338/204
[58] Field of Search ................................ 252/518, 520.4, 252/521.5; 423/53, 62, 409; 501/96; 338/204, 205; 428/212, 698, 704

[56] References Cited

U.S. PATENT DOCUMENTS

| | | | |
|---|---|---|---|
| 3,242,006 | 3/1966 | Gerstenberg | 117/201 |
| 3,394,087 | 7/1968 | Huang et al. | 252/512 |
| 4,205,298 | 5/1980 | Shapiro et al. | 338/308 |
| 4,209,764 | 6/1980 | Merz et al. | 338/308 |
| 4,645,621 | 2/1987 | Nair | 252/513 |
| 4,961,987 | 10/1990 | Okuno et al. | 428/209 |
| 5,102,720 | 4/1992 | Raj | 421/209 |
| 5,114,750 | 5/1992 | Howard | 427/226 |

FOREIGN PATENT DOCUMENTS 49031524  8/1974  Japan .

*Primary Examiner*—Mark Kopec
*Attorney, Agent, or Firm*—Ostrolenk, Faber, Gerb & Soffen, LLP

[57] ABSTRACT

Disclosed is a resistance material composition consisting essentially of at least one nitride of an element of Group VA and Group VIA and optionally containing an inorganic binder. The composition can be baked along with a multi-layered ceramic substrate (especially, a low-temperature-sintering, multi-layered ceramic substrate) to be integrated with Cu or the like electrodes, thereby forming built-in resistors with good characteristics within the substrate. The nitrides are preferably NbN, TaN and $Cr_2N$.

14 Claims, No Drawings

RESISTANCE MATERIAL COMPOSITION

BACKGROUND OF THE INVENTION

Field of the Invention

The present invention relates to a resistance material composition and more particularly to a resistance material composition capable of being baked in a neutral or reducing atmosphere along with a ceramic substrate, especially with a low-temperature-sintering substrate.

Background of the Invention

In general, a ceramic substrate comprising alumina, zirconia or the like is provided with circuit patterns for electrodes, resistors, etc., in order that various electronic parts can be mounted thereon. Electrodes are generally formed on the substrate by screen-printing a noble metal paste comprising Ag, an Ag—Pd alloy or the like followed by baking the thus-printed paste in air.

In order to obtain small-sized, high-density electronic products, multi-layered substrates produced by laminating a plurality of substrate materials have been developed. In such multi-layered substrates, conductors can be three-dimensionally disposed. However, if inner layers are wired and laminated on conventional alumina substrates (high-temperature-sintering substrates), high-melting-point metals having high specific resistivity, such as W (tungsten), Mo (molybdenum), etc., must be used as conductor materials since the alumina substrates are sintered at high temperatures. As a result of the use of such metals, the resistors formed have high resistance values. Therefore, the prior art was problematic in that the use of the products produced is limited.

In order to solve this problem, substrates that can be sintered at low temperatures of not higher than about 1000° C. and that can be constructed along with built-in electrode materials such as Ag, Ag—Pd or the like, have become utilized. For example, low-temperature-sintering substrates such as ceramic/glass composite substrates have been developed.

As electrode materials that can be utilized in conjunction with such low-temperature-sintering substrates, are base metal materials such as Cu, Ni, etc., in addition to the above-mentioned noble metal materials such as Ag, Ag—Pd, etc.

Where a multi-layered substrate having electrodes of Ag, Ag—Pd or the like is formed, in general, the substrate and the electrodes are baked together in air. Where a multi-layered substrate having electrodes of Cu, Ni or the like is formed, in general, the substrate and the electrodes are baked together in a neutral or reducing atmosphere.

Accordingly, where a low-temperature-sintering, multi-layered substrate to be integrated with electrodes of Cu, Ni or the like is produced, it is desirable that the resistance material composition (the resistance paste) which is to form inner resistors (that is, built-in resistors) on the substrate can also be baked in such a neutral or reducing atmosphere.

At present, for example, a resistance material composition comprising $RuO_2$ has been proposed as the resistance material composition to be used together with an electroconductive paste of Ag, Ag—Pd or the like to form electrodes, while a resistance material composition comprising $MoSi_2$—$TaSi_2$, molybdates or the like has been proposed as that to be used together with an electroconductive paste of Cu, Ni or the like to form electrodes. However, there is no known practical resistance material composition capable of being baked along with a low-temperature-sintering, multi-layered substrate to form built-in resistors in the substrate with desired characteristics.

SUMMARY OF THE INVENTION

The present invention is designed to solve the above-mentioned problems, and its object is to provide a resistance material composition which can be baked along with a ceramic substrate (especially, a low-temperature-sintering ceramic substrate) that will be integrated with Cu or other electrodes, and which can form resistors having widely-varying resistance values in a multi-layered ceramic substrate.

Specifically, the present invention provides a resistance material composition consisting essentially of at least one nitride of elements of Group VA and Group VIA, by which the above-mentioned object is attained.

The present invention also provides a resistance material composition consisting essentially of at least one nitride of elements of Group VA and Group VIA and containing an inorganic binder.

The resistance material composition of the invention, which consists essentially of at least one nitride of elements of Group VA and Group VIA, can be used for forming resistors in or on ceramic substrates.

The resistance material composition of the invention, which consists essentially of at least one nitride of elements of Group VA and Group VIA and contains an inorganic binder, can be used for forming resistors in or on ceramic substrates.

As one embodiment of the present invention, the nitride of elements of Group VA and Group VIA is at least one of NbN, TaN and $Cr_2N$.

As another embodiment of the invention, the composition comprises the nitride and the inorganic binder in a ratio by weight of from about 50 to less than 100 parts of the nitride to from more than 0 to about 50 parts of the inorganic binder.

As still another embodiment of the invention, the inorganic binder is a mixture of B—Si—Ba—Ca—Al glass frit and the composition oxides of the ceramic substrate to which the composition of the invention shall be applied at about the same ratio as those constituting the ceramic substrate.

DETAILED DESCRIPTION OF THE INVENTION

The inorganic binder, if any, in the resistance material composition of the present invention functions to vary the resistance value of the resistor to be made of the composition. Therefore, by varying the ratio of the nitride resistance material to the inorganic binder in the resistance material composition of the invention within a predetermined range, the composition can be used in forming resistors having a desired resistance value in a low-temperature-sintering, multi-layered substrate to be integrated with Cu electrodes or the like.

The ceramic substrates to which the resistance material composition of the present invention is applied to form resistors therein are not specifically limited. However, it is desirable to apply the composition of the invention to a low-temperature-sintering substrate such as that comprised of about 30% by weight of BaO, about 5% by weight of $Al_2O_3$, about 60% by weight of $SiO_2$, about 2% by weight of CaO and about 3% by weight of $B_2O_3$ (hereinafter referred to as substrate A) or to a low-temperature-sintering substrate comprised of about 15% by weight of BaO, about 15% by weight of SrO, about 30% by weight of $SiO_2$, about 30% by weight of $ZrO_2$ and about 10% by weight of $Al_2O_3$ (hereinafter referred to as substrate B). The composition applied to such a substrate can be baked along with the substrate to form resistors with good characteristics in the substrate. In this case, the present invention produces extremely meaningful results. The above-mentioned substrate A can be pre-baked and baked in a nitrogen-steam atmosphere comprising nitrogen as a carrier gas and containing minor amounts of oxygen and hydrogen (e.g., $N_2$: from 99.7 to 99.8%) at from 850 to 1000° C., and the resistance material composition of the present invention can be baked along with such a multi-layered substrate.

It is desirable that the ratio by weight of the nitride resistance material to the inorganic binder is such that the nitride resistance material is from about 50 to less than 100 parts while the inorganic binder is from more than 0 to about 50 parts. This is because if the proportion of the inorganic binder is more than about 50%, the resistance value of the resistor to be formed will greatly increase to 1 GΩ or more with the result that the resistor attains such a high resistance value that it is not practicable. Preferably, the nitride is about 60–90% of the composition.

It is also desirable that the inorganic binder incorporated into the resistance material composition of the present invention is a combination of B—Si—Ba—Ca—Al glass frit and the composition oxides that are common to the ceramic substrate to which the composition of the invention will be applied while present in a ratio which is nearly the same as those constituting the ceramic substrate. If the composition of the invention contains such an inorganic binder, the effect of the present invention to form resistors having desired resistance values can be ensured more reliably. The B—Si—Ba—Ca—Al glass frit may additionally contain oxides of Nb (niobium), K (potassium), etc.

Where the resistance material composition of the present invention is baked along with a ceramic substrate, the baking temperature may be varied within the range of from about 850° to 1000° C., whereby the level of the resistance values of the resistors to be formed can be appropriately controlled.

Next, examples of the present invention are described below, which demonstrate the characteristics of the invention in more detail. However, these examples do not whatsoever restrict the scope of the present invention.

EXAMPLES

On a green sheet of a low-temperature-sintering substrate, namely substrate A comprised of about 30% by weight of BaO, about 5% by weight of $Al_2O_3$, about 60% by weight of $SiO_2$, about 2% by weight of Cao and about 3% by weight of $B_2O_3$, an electroconductive paste obtained by kneading Cu powder and an organic vehicle, and a resistance paste obtained by kneading a resistance material composition comprising a nitride of an element of Group VA or Group VIA (specifically NbN, TaN or $Cr_2N$) and an inorganic binder, along with an organic vehicle were printed.

As shown in Table 1, each composition comprised a nitride of an element of Group VA or Group VIA as the resistance material and an inorganic binder (B—Si—Ba—Ca—Al glass frit to which had been added $K_2O$ and $Nb_2O_5$ (25.9% by weight of $B_2O_3$, 19.5% by weight of $SiO_2$, 28.5% by weight of BaO, 5.8% by weight of CaO, 10.0% by weight of $Al_2O_3$, 2.8% by weight of $K_2O$. and 7.5% by weight of $Nb_2O_3$) alone or in combination with composition oxides that are common to the low-temperature-sintering substrate A (about 30% BaO, about 5% $Al_2O_3$, about 60% $SiO_2$, about 2% CaO and about 3% $B_2O_3$).

TABLE 1

| Sample No. | Resistance Material | Resistance Material (wt. %) | Glass Frit | Composition Oxides | Resistance Value (Ω) |
|---|---|---|---|---|---|
| 1 | NbN | 100 | 0 | 0 | 215 |
| 2 | NbN | 95 | 5 | 0 | 268 |
| 3 | NbN | 70 | 30 | 0 | 372K |
| 4 | NbN | 70 | 20 | 10 | 81K |
| 5 | NbN | 50 | 50 | 0 | 635K |
| *6 | NbN | 48 | 52 | 0 | 1 G or more |
| 7 | TaN | 100 | 0 | 0 | 770 |
| 8 | TaN | 95 | 5 | 0 | 793 |
| 9 | TaN | 70 | 30 | 0 | 57K |
| 10 | TaN | 70 | 20 | 10 | 31K |
| 11 | TaN | 50 | 50 | 0 | 310K |
| *12 | TaN | 48 | 52 | 0 | 1 G or more |
| 13 | $Cr_2N$ | 100 | 0 | 0 | 30 |
| 14 | $Cr_2N$ | 95 | 5 | 0 | 31 |
| 15 | $Cr_2N$ | 70 | 30 | 0 | 132K |
| 16 | $Cr_2N$ | 70 | 20 | 10 | 67K |
| 17 | $Cr_2N$ | 50 | 50 | 0 | 1.3M |
| *18 | $Cr_2N$ | 48 | 52 | 0 | 1 G or more |

Next, each green sheet was blanked, the resulting pieces were laminated under pressure, and the resulting laminate was pre-baked and baked in a nitrogen-steam atmosphere comprising nitrogen as the carrier gas and contaning minor amounts of oxygen and hydrogen ($N_2$: from 99.7 to 99.8%) at from 850° to 1000° C. Thus were produced various low-temperature-sintered, multi-layered substrates integrated with built-in electrodes and resistors.

In the samples thus produced in these examples, through-holes were formed at predetermined positions, through which the inner resistors and other parts were electrically connected with each other.

The resistance value of each resistor thus formed was measured. The data obtained are shown in Table 1 above, in which the sample numbers with (*) are comparative examples not falling within the scope of the present invention.

As can be seen in Table 1, it is understood that the samples of the resistance material composition of the present invention gave practicable resistors having desired resistance values. In addition, it is also understood that the samples containing both the B—Si—Ba—Ca—Al glass frit and the composition oxides as the inorganic binder (Sample Numbers 4, 10, 16) gave resistors having smaller resistance values than the resistors formed from Sample Numbers 3, 9 and 15 containing the glass frit only.

In the above-mentioned examples, NbN, TaN and $Cr_2N$ were used as the nitride of an element of Group VA or Group VIA, but this is not limitative. Apart from these nitrides, it is also possible to employ any other nitrides of elements of Group VA and Group VIA in the present invention or combinations of such nitrides.

In the above-mentioned examples, a B—Si—Ba—Ca—Al glass frit containing $K_2O$ and $Nb_2O_5$ and having the composition mentioned above was used. Again this is not limitative. Apart from this, it is also possible to employ other B—Si—Ba—Ca—Al glass frits having different compositions and even other B—Si—Ba—Ca—Nb glass frits and B—Si—Zn—Al glass frits having different compositions, in the present invention, whereby the characteristics of the resistors to be formed can be varied.

Needless-to-say, the present invention is not whatsoever restricted to the examples mentioned hereinabove but shall include any other various changes, applications and modifications which do not overstep the scope and the spirit of the invention.

As has been described in detail hereinabove, the resistance material composition of the present invention consists essentially of at least one resistance material which is a nitride of an element of Group VA and Group VIA and optionally contains an inorganic binder (glass frit, etc.) and can form resistors having varying resistance values. Therefore, by varying the mixing ratio of the inorganic binder to the nitride resistance material within a predetermined range, it is possible to form resistors having desired resistance values without worsening the other characteristics of the resistors.

In addition, since the resistance material composition of the present invention can be baked in a neutral or reducing atmosphere and since it can be baked along with a multi-layered ceramic substrate such as low-temperature-sintering, multi-layered substrate, etc., while being disposed within the substrate to thereby form resistors within the substrate (that is, to form built-in resistors within the substrate), it is possible to produce small-sized circuit boards using the composition of the invention, and to reduce the production costs of such circuit boards by simplifying the process of producing the multi-layered ceramic substrate (especially, low-temperature-sintering, multi-layered ceramic substrates) to which the composition of the invention shall be applied.

Moreover, since the resistors to be formed from the resistance material composition of the present invention can be integrated within a multi-layered ceramic substrate in the form of built-in resistors, the durability of the resistors formed is advantageously increased.

Furthermore, when the resistance material composition of the present invention comprises at least one of NbN, TaN and $Cr_2N$ as the nitride of an element of Group VA and Group VIA, it is possible to more reliably ensure the advantages of the invention.

In addition, when the resistance material composition of the present invention comprises the nitride resistance material and the inorganic binder in a ratio by weight of from about 50 to 100 parts of the nitride to from 0 to about 50 parts of the inorganic binder, it is possible to surely form resistors of the composition having desired resistance values within low-temperature-sintering, multi-layered substrates to be integrated with Cu electrodes, etc. Employing this embodiment of the present invention, it is possible to more reliably ensure the advantages of the invention.

Moreover, when the resistance material composition of the present invention comprises, as the inorganic binder, B—Si—Ba—Ca—Al glass frit and composition oxides that are common to the ceramic substrate to which the composition of the invention shall be applied in about the same ratio as constituting the ceramic substrate, it is possible to surely form resistors of the composition having desired resistance values without worsening other characteristics of the resistors formed. Employing this embodiment of the present invention, it is possible to more reliably ensure the advantages of the invention.

The resistance material composition of the present invention is not limited relative to the kind of the ceramic substrate to which the composition shall be applied to form resistors. However, if the composition is applied to low-temperature-sintering substrates, for example, the above-mentioned substrate A or substrate B, to form resistors, it can be sintered along with the substrates and resistors with good characteristics can be formed. Therefore, this embodiment of the present invention is especially advantageous.

While the invention has been described in detail and with reference to specific embodiments thereof, it will be apparent to one skilled in the art that various changes and modifications can be made therein without departing from the spirit and scope thereof.

What is claimed is:

1. A ceramic substrate having a sintering temperature of not more than about 1000° C. and having therein a resistance material composition forming a resistor and consisting essentially of at least one nitride of an element of Group VA and Group VIA.

2. The ceramic substrate as claimed in claim 1, wherein the resistance material composition contains an inorganic binder.

3. The ceramic substrate as claimed in claim 2, wherein at least one nitride is NbN, TaN or $Cr_2N$.

4. The ceramic substrate as claimed in claim 2, wherein the ratio by weight of the nitride to the inorganic binder is such that the nitride is from about 50 to less than 100 parts while the inorganic binder is from more than 0 to about 50 parts.

5. The ceramic substrate as claimed in claim 2, wherein the inorganic binder is a combination of B—Si—Ba—Ca—Al glass frit and composition oxides that are common to the ceramic substrate to which the composition will be applied at about the same ratio in the ceramic substrate.

6. The ceramic substrate of claim 1 wherein said ceramic substrate comprises about 30% by weight of BaO, about 5% by weight of $Al_2O_3$, about 60% by weight of $SiO_2$, about 2% by weight of CaO and about 3% by weight of $B_2O_3$.

7. The ceramic substrate of 1 wherein said ceramic substrate comprises about 15% by weight of BaO, about 15% by weight of SrO, about 30% by weight of $SiO_2$, about 30% by weight of $ZrO_2$ and about 10% by weight of $Al_2O_3$.

8. A multi-layer substrate comprising a plurality of ceramic substrates having a sintering temperature of not more than about 1000° C. and in which at least one of the ceramic substrates has thereon a resistance material composition forming a resistor within said multi-layer substrate consisting essentially of at least one nitride of an element of Group VA and Group VIA.

9. The ceramic substrate as claimed in claim 8, wherein the resistance material composition contains an inorganic binder.

10. The substrate as claimed in claim 9, wherein at least one nitride is NbN, TaN or $Cr_2N$.

11. The substrate as claimed in claim 9, wherein the ratio by weight of the nitride to the inorganic binder is such that the nitride is from about 50 to less than 100 parts while the inorganic binder is from more than 0 to about 50 parts.

12. The substrate as claimed in claim 11, wherein the inorganic binder is a combination of B—Si—Ba—Ca—Al glass frit and composition oxides that are common to the ceramic substrate to which the composition will be applied at about the same ratio as in the ceramic substrate.

13. The substrate as claimed in claim 12, wherein the inorganic binder contains both the glass frit and the composition oxides.

14. The substrate as claimed in claim 8, wherein in which at least one of the ceramic substrates has a base metal electrode thereon.

* * * * *